United States Patent [19]
Bowles

[11] Patent Number: 5,498,980
[45] Date of Patent: Mar. 12, 1996

[54] TERNARY/BINARY CONVERTER CIRCUIT

[75] Inventor: Gary-Alexander Bowles, München, Germany

[73] Assignee: Siemens Aktiengesellschaft, Munich, Germany

[21] Appl. No.: 126,333

[22] Filed: Sep. 24, 1993

[30]   Foreign Application Priority Data

Sep. 24, 1992 [DE] Germany .............................. 42 32 049

[51] Int. Cl.$^6$ .................................................. H03K 19/02
[52] U.S. Cl. .................................. 326/60; 326/59
[58] Field of Search ................................. 326/59, 60, 80, 326/121

[56]   References Cited

U.S. PATENT DOCUMENTS

| | | | |
|---|---|---|---|
| 4,465,944 | 8/1984 | Shin ........................................ | 326/60 |
| 5,045,728 | 9/1991 | Crafts ...................................... | 326/60 |
| 5,124,590 | 6/1992 | Liu et al. ................................ | 326/60 |
| 5,194,766 | 3/1993 | Sugawara ................................ | 326/60 |

Primary Examiner—Edward P. Westin
Assistant Examiner—Andrew Sanders
Attorney, Agent, or Firm—Herbert L. Lerner; Laurence A. Greenberg

[57]           ABSTRACT

An integrated semiconductor circuit configuration includes one input of the circuit configuration for receiving a ternary input signal, and two outputs of the circuit configuration for supplying two binary output signals converted from the input signal. First, second, third and fourth resistors are connected in series between an operating voltage potential and a reference potential, defining a first connecting node between the first and the second resistors, a second connecting node between the second and the third resistors, and a third connecting node between the third and the fourth resistors. The second connecting node forms the input of the circuit configuration. A first threshold value decision circuit has an input connected to the first connecting node and has an output. A second threshold value decision circuit has an input connected to the third connecting node and has an output. A logic circuit is connected to the outputs of the threshold value decision circuits and has outputs forming the outputs of the circuit configuration.

10 Claims, 2 Drawing Sheets

TERNARY/BINARY CONVERTER CIRCUIT

BACKGROUND OF THE INVENTION

FIELD OF THE INVENTION

The invention relates to an integrated semiconductor circuit configuration.

In order to test integrated semiconductor circuits, such as semiconductor memories, input terminals must be provided that are no longer needed during normal operation and take away space. It is accordingly usual to reduce two internal terminals to only one external terminal through the use of a converter circuit. Then, by means of the converter circuit, a ternary input signal at the external terminal is, for instance, converted into two binary signals at the two internal terminals. However, that still required input signals having a level which was higher than the operating voltage of the circuit.

SUMMARY OF THE INVENTION

It is accordingly an object of the invention to provide an integrated semiconductor circuit configuration, which overcomes the hereinafore-mentioned disadvantages of the heretofore-known devices of this general type and which converts a ternary input signal into two binary output signals, with the circuit being capable of processing an input signal having a maximum level which is equal to the operating voltage.

With the foregoing and other objects in view there is provided, in accordance with the invention, an integrated semiconductor circuit configuration, comprising one input of the semiconductor circuit configuration for receiving a ternary input signal, and two outputs of the semiconductor circuit configuration for supplying two binary output signals being converted from the input signal; first, second, third and fourth resistors being connected in series between an operating voltage potential and a reference potential, defining a first connecting node between the first and the second resistors, a second connecting node between the second and the third resistors, and a third connecting node between the third and the fourth resistors, the second connecting node forming the input of the semiconductor circuit configuration; a first threshold value decision circuit having an input connected to the first connecting node, and having an output; a second threshold value decision circuit having an input connected to the third connecting node, and having an output; and a logic circuit being connected to the outputs of the threshold value decision circuits, and having outputs forming the outputs of the semiconductor circuit configuration.

The ternary input signal of the semiconductor circuit configuration according to the invention may assume three different values, namely the value of the reference potential, the value of the operating potential, or a value between these two. The quiescent state of the semiconductor circuit configuration is defined by one of the three values. The other two values are converted into two binary values as needed by means of the logic circuit and define the two active operating states.

In accordance with another feature of the invention, if the entire integrated semiconductor circuit configuration is made by the MOS technique, then the first and second threshold value decision circuits are advantageously each formed by one CMOS inverter. The switching threshold can be adjusted by suitably dimensioning the n-channel and p-channel MOS transistors forming the CMOS inverters.

In accordance with a further feature of the invention, since it is relatively difficult to construct resistors in integrated semiconductor circuits, the first resistor is advantageously formed by a first p-channel MOS transistor having a gate terminal which is connected to the reference potential. The second resistor is formed by a first n-channel MOS transistor being operated as a diode, and the third resistor is formed by a second p-channel MOS transistor being operated as a diode. The fourth resistor is formed by a second n-channel MOS transistor having a gate terminal which is connected to the operating voltage potential.

This embodiment has the advantage of permitting the quiescent state to be adjusted by not connecting the input terminal. However, it also has the disadvantage of permitting a quiescent current to flow through the four series-connected resistors in the quiescent state, thus producing a power loss.

In accordance with an added feature of the invention, in order to avert this power loss, in an advantageous manner either the gate terminal of the CMOS inverter forming the first p-channel MOS transistor with the output of the first threshold value decision circuit, or the gate terminal of the second n-channel MOS transistor, is connected to the output of the CMOS inverter forming the second threshold value decision circuit. In that case, however, the input terminal must be applied to either reference potential or operating voltage potential in the quiescent state.

In accordance with an additional feature of the invention, in order to make the CMOS inverters switch through faster, a third n-channel MOS transistor having a gate terminal which is connected to the output of the first threshold value decision circuit is disposed parallel to the second resistor, and a third p-channel MOS transistor, having a gate terminal which is connected to the output of the second threshold value decision circuit is disposed parallel to the third resistor.

Since a latching effect of the third n-channel and p-channel MOS transistors in combination with the first and second CMOS inverters might occur due to this further feature of the semiconductor circuit configuration, it is practical to place a fourth n-channel MOS transistor having a gate terminal which is connected to the second connecting node, between the output of the first CMOS inverter and the reference potential, and to place a fourth p-channel MOS transistor, having a gate terminal which is connected to the second connecting node, between the operating voltage potential and the output of the second threshold value decision circuit.

Other features which are considered as characteristic for the invention are set forth in the appended claims.

Although the invention is illustrated and described herein as embodied in an integrated semiconductor circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
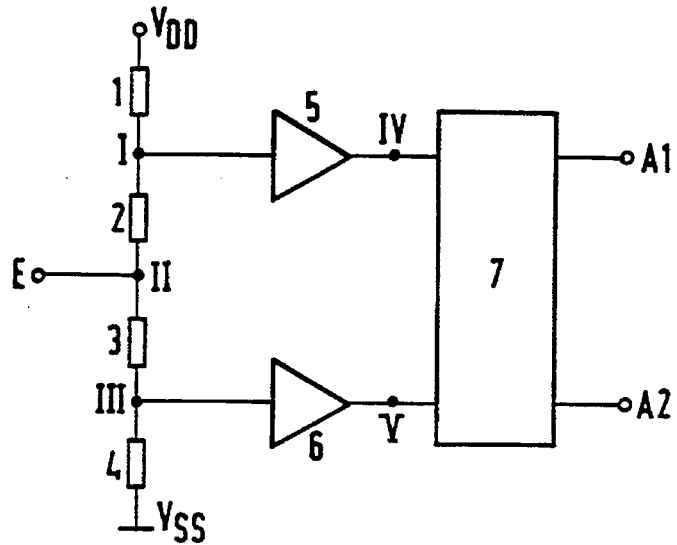
FIG. 1 is a basic schematic and block circuit diagram.

Referring now to the figures of the drawing in detail and first, particularly, to FIG. 1 thereof, there is seen a controllable first resistor 1 connected in series with a second resistor 2, a third resistor 3 and a fourth resistor 4, between an operating voltage potential $V_{DD}$ and a reference potential $V_{SS}$. As a result, a first connecting node I, a second connecting node II and a third connecting node III are formed between the resistors 1, 2, 3, 4. The second connecting node II forms an input E of the semiconductor circuit configuration shown in FIG. 1. This input is acted upon by a ternary input signal, in other words an input signal that can assume three states. The three states are defined by the reference potential $V_{SS}$, the operating voltage potential $V_{DD}$, and a potential that is between these two potentials. An input of a first threshold value decision circuit 5 is connected to the first connecting node I, and an input of a second threshold value decision circuit 6 is connected to the third connecting node III. Outputs IV, V of the two threshold value decision circuits 5, 6 are connected to a logic circuit 7 having two outputs forming outputs A1, A2 of the semiconductor circuit configuration.

The resistances of the four resistors 1–4 and the switching thresholds of the threshold value decision circuits 5, 6 are selected in such a way that in the semiconductor configuration according to the invention, at an input signal having a state which corresponds to the reference potential $V_{SS}$, neither of the two threshold value decision circuits 5, 6 switches through, and at an input signal having a state that corresponds to the operating voltage potential $V_{DD}$, both threshold value decision circuits 5, 6 switch through.

Through the use of a suitable embodiment of the logic circuit 7, which is within the competence of one skilled in the art, the particular desired binary output signal can be furnished at the outputs A1, A2.

Figure 2:
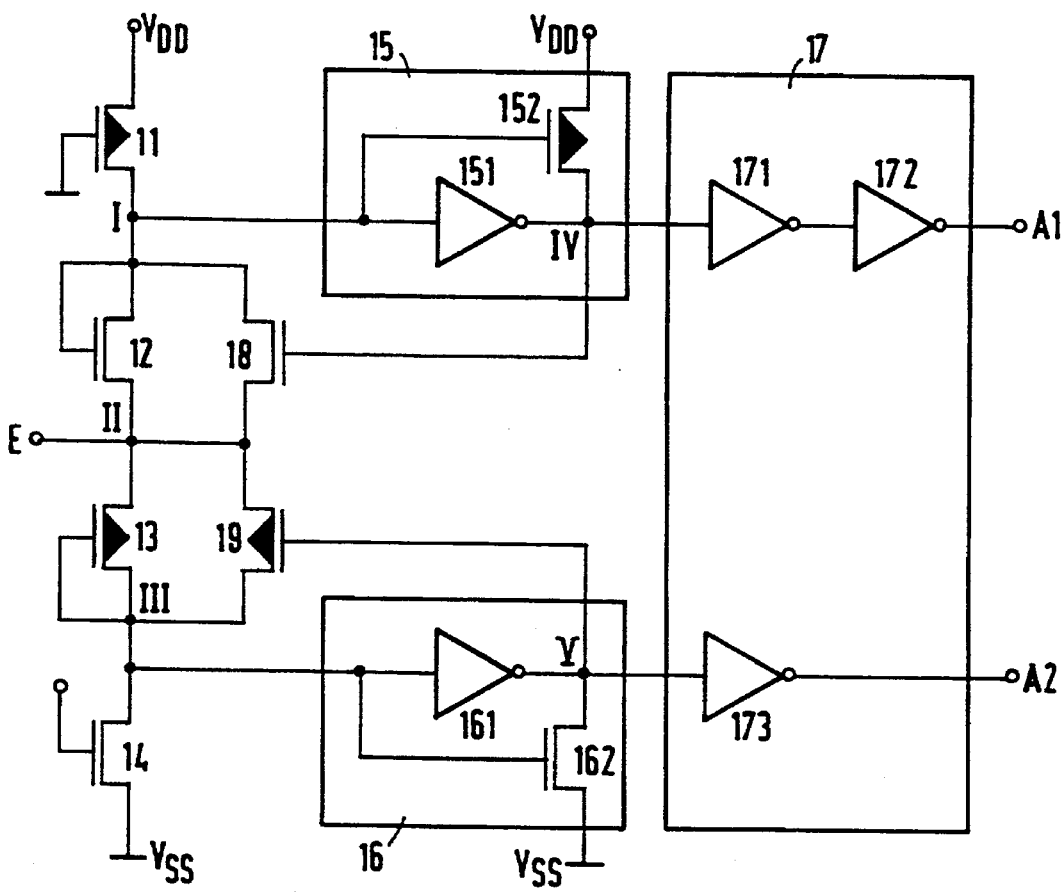
FIG. 2 is a schematic circuit diagram of a first embodiment of the integrated semiconductor circuit configuration according to the invention.

FIG. 2 shows a first, more-detailed version of the integrated semiconductor circuit configuration of the invention, in which the four resistors 1–4 are formed by MOS transistors 11, 12, 13, 14. A first p-channel MOS transistor 11 having a gate terminal which is at reference potential, is connected in series between the operating voltage potential $V_{DD}$ and the reference potential $V_{SS}$, with a first n-channel MOS transistor 12 being wired as a diode, a second p-channel MOS transistor 13 being wired as a diode, and a second n-channel MOS transistor 14 having a gate terminal which is at the operating voltage potential $V_{DD}$.

Three connecting nodes I, II, III are again formed between the four MOS transistors 11–14 and once again the second connecting node II forms the input E of the semiconductor circuit configuration. A first threshold value decision circuit 15 having an input which is connected to the first connecting node I, is formed by a symmetrical CMOS inverter 151, to which a p-channel MOS transistor 152 is connected in parallel, so that the switching threshold of the threshold value decision circuit 15 is shifted to higher values.

A second threshold value decision circuit 16 having an input which is connected to the third connecting node III, likewise includes a symmetrical CMOS inverter 161, but connected parallel to it is an n-channel MOS transistor 162, so that its switching threshold shifts to lower values. In this way it becomes possible for the states of the input signal to have wider tolerance ranges.

A third n-channel MOS transistor 18 which is disposed between the first connecting node I and the second connecting node II, has a gate terminal which is connected to an output IV of the first threshold value decision circuit 15. A third p-channel MOS transistor 19 which is disposed between the second connecting node II and the third connecting node III, has a gate terminal which is connected to an output V of the second threshold value decision circuit 16.

An output of the first threshold value decision circuit 15 is connected to the first output A1 of the semiconductor circuit configuration through a cascade circuit of two inverters 171, 172. An output of the second threshold value decision circuit 16 is connected to the second output A2 of the semiconductor configuration through an inverter 173. The three inverters 171, 172, 173 form a logic circuit 17.

The four series-connected MOS transistors 11–14 are dimensioned in such a way that given a floating input E of the semiconductor circuit configuration, a potential of approximately 0.5 $(V_{DD}-V_{SS})$ develops at the connecting node II. At the connecting node I, a potential of approximately 0.95 $(V_{DD}-V_{SS})$ develops, and at the connecting III, a potential of approximately 0.05 $(V_{DD}-V_{SS})$ develops. This input state is the quiescent state. The second threshold value decision circuit 16 has not switched through at that time, so that a logical high level results at its output V, and correspondingly a logical low level results at the second output A2 of the semiconductor configuration. The first threshold value decision circuit 15 has switched through, so that at its output IV, a logical low level is established, and at the first output A1 of the semiconductor circuit configuration a logical low level is also established.

If the input E of the semiconductor configuration is applied to reference potential, then the potential at the third connecting node III likewise drops to reference potential, so that the second threshold value decision circuit 16 continues not to be switched through, and the low level is maintained at the second output A2 of the semiconductor circuit configuration. The potential at the first connecting node I likewise drops, so that the first threshold value decision circuit 15 switches, resulting in the appearance of a high level at its output IV. The gate terminal of the third n-channel MOS transistor 18 is acted upon by this level, causing it to have low impedance and pulling the connecting node I down to the potential of the connecting node II, that is reference potential. This stabilizes the switching state of the first threshold value decision circuit 15. The first output A1 of the semiconductor configuration then has a high level. Conversely, if the input E is applied to the operating voltage potential $V_{DD}$, then the first connecting node I is likewise at this potential, which means that the output IV of the first threshold value decision circuit 15 as well as the first output A1 of the semiconductor circuit configuration are at low potential. The potential of the third connecting node III is raised somewhat, so that this second threshold value decision circuit 16 switches, and its output V has a low level. This makes the third p-channel MOS transistor 19 have low impedance, and as a result the third connecting node III is raised to operating voltage potential $V_{DD}$ and stabilizes the state of the second threshold value decision circuit 16. The second output A2 of the semiconductor circuit configuration in this case has a high level. The following truth table accordingly results:

| E | A1 | A2 |
|---|---|---|
| / | 0 | 0 |
| $V_{DD}$ | 0 | 1 |

| E | A1 | A2 |
|---|----|----|
| $V_{SS}$ | 1 | 0 |

The advantage of the semiconductor circuit of FIG. 2 is that in the quiescent state, in other words when the circuit configuration, which after all is a component of a larger semiconductor circuit, is not needed, the input E can be left in a floating state, or in other words need not be switched or acted upon by a signal. However, it then has the disadvantage that in this quiescent state a quiescent current flows through the four series-connected MOS transistors, and this causes a power loss.

Figure 3:
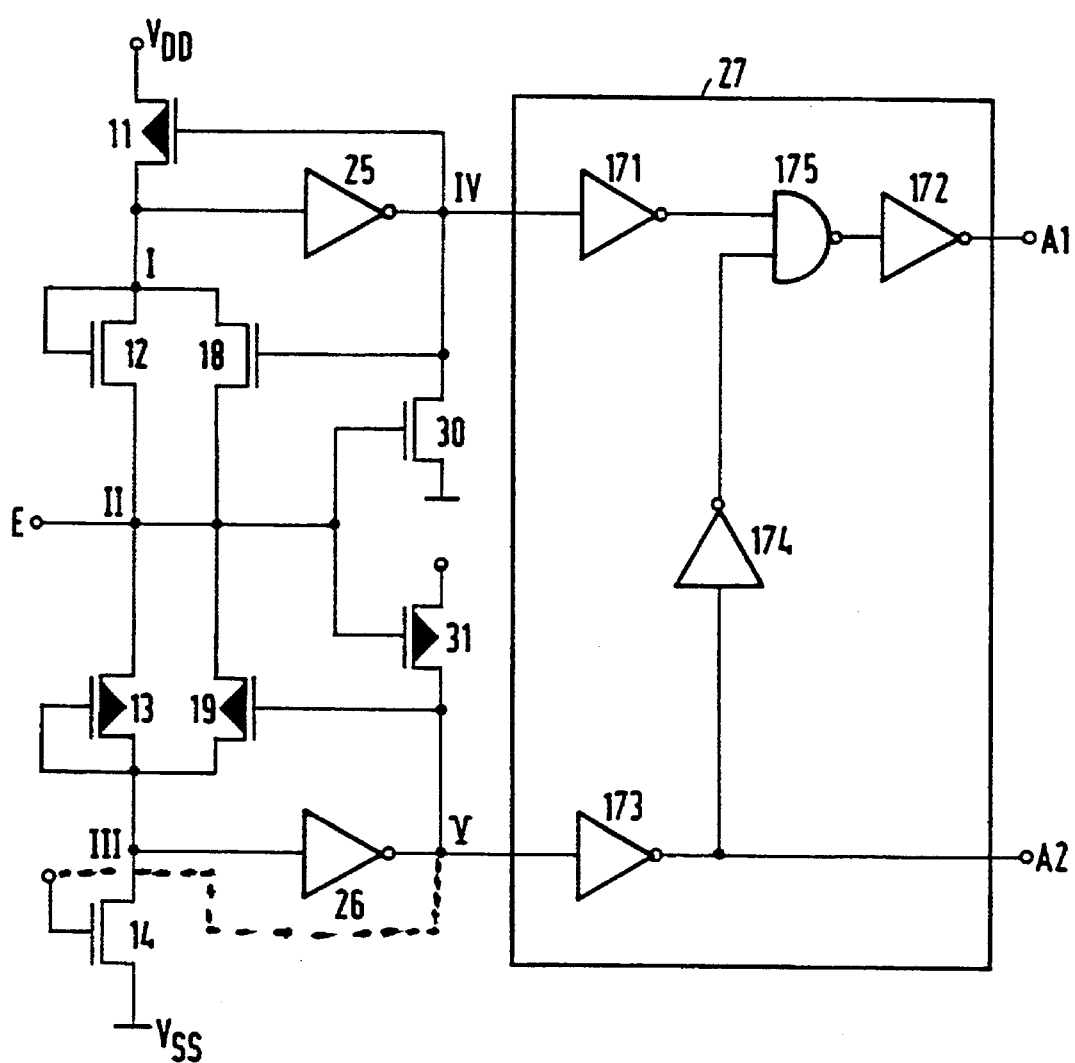
FIG. 3 is a schematic circuit diagram of a second embodiment of the integrated semiconductor circuit configuration according to the invention.

This disadvantage is averted by the semiconductor circuit configuration of FIG. 3, in which identical circuit components that perform the same function as in the circuit configuration of FIG. 2 are identified by the same reference numerals.

The essential distinction between the circuits of FIGS. 2 and 3 is that the gate terminal of the first p-channel MOS transistor 11 is not applied to reference potential but rather is connected to the output IV of a first threshold value decision circuit 25. If the input E is then applied to reference potential, the first threshold value decision circuit 25 switches its output IV to a high level, causing the first p-channel MOS transistor 11 to be switched with high impedance, and as a result no further current can flow through the four series-connected MOS transistors 11–14. This state is then the quiescent state.

Naturally, it is equally possible for the gate terminal of the second n-channel MOS transistor 14 to be connected to the output V of a second threshold value decision circuit 26, but in that case the input E would then have to be applied to operating voltage potential, in order to block this second n-channel MOS transistor 14 and therefore to avert a quiescent current.

In order to obtain the same configuration of levels of the two outputs A1, A2 of the semiconductor circuit configuration with respect to the quiescent state and the two active operating states as in the semiconductor circuit configuration of FIG. 2, a different logic circuit 27 is necessary. Besides the inverters 171, 172, 173 that are already included in the logic circuit 17 of FIG. 2, a NAND gate 175 is connected between the two inverters 171, 172, and an input of the NAND gate is connected through a further inverter 174 to the second output A2 of the semiconductor circuit configuration. The result which this achieves is that in the quiescent state, that is when the input E is at reference potential, the two inputs A1, A2 have a low level. If the input E is at operating voltage potential, the first output A1 has a high level and the second output A2 has a low level, and if the input E has a potential of 0.5 $(V_{DD}-V_{SS})$, then the first output A1 has a low level and the second output A2 has a high level.

In order to avert latchup of the first threshold value decision circuit 25 through the third n-channel MOS transistor 18, or of the second threshold value decision circuit 26 through the third p-channel MOS transistor 19, in the event that the input E has a potential of 0.5 $(V_{DD}-V_{SS})$, a fourth n-channel MOS transistor 30 having a gate terminal which is connected to the second connecting node II, is disposed between the output IV of the threshold value decision circuit 25 and reference potential $V_{SS}$, and a fourth p-channel MOS transistor 31 having a gate terminal which is likewise connected to the second connecting node II, is disposed between the output V of the second threshold value decision circuit 26 and the operating voltage potential $V_{DD}$.

The two threshold value decision circuits 25, 26 are asymmetrical CMOS inverters which, by way of example, may be formed by the parallel connected of a symmetrical CMOS inverter to an n-channel MOS transistor or to a p-channel MOS transistor.

We claim:

1. An integrated semiconductor circuit configuration, comprising:

one input of the semiconductor circuit configuration for receiving a ternary input signal, and two outputs of the semiconductor circuit configuration for supplying two binary output signals;

first, second, third and fourth resistors being connected in series between an operating voltage potential and a reference potential, defining a first connecting node between said first and said second resistors, a second connecting node between said second and said third resistors, and a third connecting node between said third and said fourth resistors, the second connecting node forming the input of the semiconductor circuit configuration;

a first threshold value decision circuit having a first. CMOS inverter, an input connected to the first connecting node, and having an output;

a second threshold value decision circuit having a second CMOS inverter, an input connected to the third connecting node, and having an output; and a logic circuit being connected to the outputs of said threshold value decision circuits, and having outputs forming the outputs of the semiconductor circuit configuration.

2. The integrated semiconductor circuit configuration according to claim 1, wherein:

said first resistor is a first p-channel MOS transistor having a gate terminal being connected to the reference potential;

said second resistor is a first n-channel MOS transistor being operated as a diode;

said third resistor is a second p-channel MOS transistor being operated as a diode; and said fourth resistor is a second n-channel MOS transistor having a gate terminal being connected to the operating voltage potential.

3. The integrated semiconductor circuit configuration according to claim 1, wherein:

said first resistor is a first p-channel MOS transistor having a gate terminal being connected to the output of said first threshold value decision circuit;

said second resistor is a first n-channel MOS transistor being operated as a diode;

said third resistor is a second p-channel MOS transistor being operated as a diode; and said fourth resistor is a second n-channel MOS transistor having a gate terminal being connected to the operating voltage potential.

4. The integrated semiconductor circuit configuration according to claim 1, wherein:

said first resistor is a first p-channel MOS transistor having a gate terminal being connected to the reference potential;

said second resistor is a first n-channel MOS transistor being operated as a diode;

said third resistor is a second p-channel MOS transistor being operated as a diode; and said fourth resistor is a second n-channel MOS transistor having a gate terminal being connected to the output of said second threshold value decision circuit.

5. The integrated semiconductor circuit configuration according to claim 2, including:
a third n-channel MOS transistor being connected parallel to said second resistor, and having a gate terminal being connected to the output of said first threshold value decision circuit; and
a third p-channel MOS transistor being connected parallel to the third resistor, and having a gate terminal being connected to the output of said second threshold value decision circuit.

6. The integrated semiconductor circuit configuration according to claim 3, including:
a third n-channel MOS transistor being connected parallel to said second resistor, and having a gate terminal being connected to the output of said first threshold value decision circuit; and
a third p-channel MOS transistor being connected parallel to the third resistor, and having a gate terminal being connected to the output of said second threshold value decision circuit.

7. The integrated semiconductor circuit configuration according to claim 4, including:
a third n-channel MOS transistor being connected parallel to said second resistor, and having a gate terminal being connected to the output of said first threshold value decision circuit; and
a third p-channel MOS transistor being connected parallel to the third resistor, and having a gate terminal being connected to the output of said second threshold value decision circuit.

8. The integrated semiconductor circuit configuration according to claim 5, including:
a fourth n-channel MOS transistor being connected between the output of said first threshold value decision circuit and the reference potential, and having a gate terminal being connected to the second connecting node; and
a fourth p-channel MOS transistor being connected between the operating voltage potential and the output of said second threshold value decision circuit, and having a gate terminal being connected to the second connecting node.

9. The integrated semiconductor circuit configuration according to claim 6, including:
a fourth n-channel MOS transistor being connected between the output of said first threshold value decision circuit and the reference potential, and having a gate terminal being connected to the second connecting node; and
a fourth p-channel MOS transistor being connected between the operating voltage potential and the output of said second threshold value decision circuit, and having a gate terminal being connected to the second connecting node.

10. The integrated semiconductor circuit configuration according to claim 7, including:
a fourth n-channel MOS transistor being connected between the output of said first threshold value decision circuit and the reference potential, and having a gate terminal being connected to the second connecting node; and
a fourth p-channel MOS transistor being connected between the operating voltage potential and the output of said second threshold value decision circuit, and having a gate terminal being connected to the second connecting node.

* * * * *